(12) United States Patent
Kazav et al.

(10) Patent No.: US 10,644,472 B2
(45) Date of Patent: May 5, 2020

(54) CABLE ADAPTER

(71) Applicant: Mellanox Technologies, Ltd., Yokneam (IL)

(72) Inventors: Yaniv Kazav, Hadera (IL); Andrey Ger, Ramat Gan (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/154,746

(22) Filed: Oct. 9, 2018

(65) Prior Publication Data
US 2019/0044299 A1      Feb. 7, 2019

Related U.S. Application Data

(63) Continuation-in-part of application No. 15/635,236, filed on Jun. 28, 2017, now Pat. No. 10,128,627.

(51) Int. Cl.
*H01R 43/26*    (2006.01)
*H05K 7/20*     (2006.01)
(Continued)

(52) U.S. Cl.
CPC .......... *H01R 43/26* (2013.01); *G02B 6/4261* (2013.01); *G02B 6/4269* (2013.01); *H01R 4/52* (2013.01);
(Continued)

(58) Field of Classification Search
CPC ...... H01R 43/26; H01R 13/518; H01R 27/00; H01R 33/90; H01R 31/06; H01R 33/88;
(Continued)

(56) References Cited

U.S. PATENT DOCUMENTS 4,367,306 A    1/1983    Maeda et al.
4,869,672 A    9/1989    Andrews, Jr.
(Continued)

FOREIGN PATENT DOCUMENTS

CN    205846322 U    12/2016

OTHER PUBLICATIONS

OSFP "Frequently Asked Questions", 2 pages, May 15, 2017.
(Continued)

*Primary Examiner* — Amy Cohen Johnson
*Assistant Examiner* — Paul D Baillargeon
(74) *Attorney, Agent, or Firm* — Kligler & Associates Patent Attorneys Ltd

(57) ABSTRACT

A communication device includes a mechanical frame, which is configured to be inserted into a multi-channel Small Form-Factor Pluggable (SFP) receptacle that is compliant with a first SFP standard and to receive inside the frame an SFP connector that is compliant with a second SFP standard, which is different from the first SFP standard. First electrical terminals, held by the mechanical frame, are configured to mate with respective first pins of the SFP receptacle, and second electrical terminals, electrically coupled within the mechanical frame to the first electrical terminals, are configured to mate with respective second pins of the SFP connector. A heat sink is mounted on the mechanical frame and configured to make a positive contact with the SFP connector when the SFP connector is inserted into the mechanical frame and to be contained completely within the SFP receptacle when the mechanical frame is inserted into the SFP receptacle.

20 Claims, 5 Drawing Sheets

(51) Int. Cl.

| | |
|---|---|
| *H01R 13/518* | (2006.01) |
| *H01R 27/00* | (2006.01) |
| *G02B 6/42* | (2006.01) |
| *H04B 1/38* | (2015.01) |
| *H01R 31/06* | (2006.01) |
| *H01R 4/52* | (2006.01) |

(52) U.S. Cl.
CPC ........... *H01R 13/518* (2013.01); *H01R 27/00* (2013.01); *H01R 31/06* (2013.01); *H04B 1/38* (2013.01); *H05K 7/20163* (2013.01); *H01R 2201/04* (2013.01)

(58) Field of Classification Search
CPC .. G02B 6/4269; G02B 6/4284; G02B 6/4261; H05K 7/2039; H05K 1/0203
USPC ........................................ 439/487, 638, 651
See application file for complete search history.

(56) References Cited

U.S. PATENT DOCUMENTS

| | | | |
|---|---|---|---|
| 4,968,260 | A | 11/1990 | Ingalsbe |
| 4,993,972 | A | 2/1991 | Lin |
| 5,087,207 | A | 2/1992 | Byrne |
| 5,277,591 | A | 1/1994 | Felcman et al. |
| 5,387,110 | A | 2/1995 | Kantner et al. |
| 5,664,950 | A | 9/1997 | Lawrence |
| 5,696,669 | A | 12/1997 | Bassler et al. |
| 5,734,558 | A | 3/1998 | Poplawski et al. |
| 5,766,020 | A | 6/1998 | Hughes |
| 5,788,521 | A | 8/1998 | Milan |
| 5,984,731 | A | 11/1999 | Laity |
| 6,183,307 | B1 | 2/2001 | Laity et al. |
| 6,183,308 | B1 | 2/2001 | Laity |
| 6,203,333 | B1 | 3/2001 | Medina et al. |
| 6,215,656 | B1 | 4/2001 | O'Neal et al. |
| 6,256,448 | B1 | 7/2001 | Shahid |
| 6,517,382 | B2 | 2/2003 | Flickinger et al. |
| 6,648,695 | B1 | 11/2003 | Wu |
| 6,773,291 | B1 | 8/2004 | Roth et al. |
| 6,814,593 | B2 | 11/2004 | Wang et al. |
| 6,816,376 | B2 | 11/2004 | Bright et al. |
| 7,028,202 | B2 | 4/2006 | Long et al. |
| 7,048,550 | B2 | 5/2006 | Hayland et al. |
| 7,335,033 | B1 | 2/2008 | Edwards, Jr. et al. |
| 7,380,993 | B2 | 6/2008 | Dallesasse |
| 7,452,139 | B2 | 11/2008 | Wang et al. |
| 7,747,292 | B2 | 6/2010 | Mezer et al. |
| 7,823,041 | B2 | 10/2010 | Mezer et al. |
| 7,934,959 | B2 | 5/2011 | Rephaeli et al. |
| 8,075,199 | B2 * | 12/2011 | Losio ..................... H04L 49/40 385/92 |
| 8,083,417 | B2 | 12/2011 | Aronson et al. |
| 8,419,444 | B2 | 4/2013 | Kagan et al. |
| 8,599,559 | B1 | 12/2013 | Morrison et al. |
| 8,641,429 | B2 * | 2/2014 | Fish ................... H01R 13/6658 439/76.1 |
| 8,767,806 | B2 * | 7/2014 | Tang ................. H04L 25/03878 375/219 |
| 8,944,704 | B2 | 2/2015 | Lagziel et al. |
| D734,728 | S | 7/2015 | Lagziel et al. |
| 9,793,667 | B1 | 10/2017 | Park et al. |
| 10,122,106 | B2 * | 11/2018 | Regnier ............... H01R 12/721 |
| 10,276,995 | B2 * | 4/2019 | Little ................... H01R 13/504 |
| 2001/0019907 | A1 | 9/2001 | Glad et al. |
| 2004/0013369 | A1 | 1/2004 | Coffey et al. |
| 2004/0023559 | A1 | 2/2004 | Wu |
| 2005/0254759 | A1 | 11/2005 | O'Brien |
| 2007/0232132 | A1 | 10/2007 | Ling et al. |
| 2007/0237464 | A1 | 10/2007 | Aronson et al. |
| 2007/0237472 | A1 | 10/2007 | Aronson et al. |
| 2008/0044141 | A1 | 2/2008 | Willis et al. |
| 2008/0069052 | A1 | 3/2008 | Mezer et al. |
| 2008/0150546 | A1 | 6/2008 | Gale |
| 2008/0249470 | A1 | 10/2008 | Malave et al. |
| 2008/0267620 | A1 | 10/2008 | Cole et al. |
| 2009/0060425 | A1 | 3/2009 | Aronson et al. |
| 2009/0061662 | A1 | 3/2009 | Chin |
| 2009/0093137 | A1 | 4/2009 | Badehi et al. |
| 2009/0093166 | A1 | 4/2009 | Fogg et al. |
| 2009/0232151 | A1 | 9/2009 | Furlong et al. |
| 2009/0247006 | A1 | 10/2009 | Thompson |
| 2010/0014566 | A1 | 1/2010 | Mezer et al. |
| 2011/0123157 | A1 | 5/2011 | Belsan et al. |
| 2012/0015552 | A1 | 1/2012 | Diab et al. |
| 2012/0141132 | A1 | 6/2012 | Walker |
| 2012/0264335 | A1 | 10/2012 | Feyder et al. |
| 2013/0071072 | A1 | 3/2013 | Xie |
| 2013/0251052 | A1 | 9/2013 | Tang et al. |
| 2015/0092363 | A1 | 4/2015 | Blier et al. |
| 2015/0282382 | A1 | 10/2015 | Nguyen |
| 2016/0006182 | A1 | 1/2016 | Patel |
| 2017/0005446 | A1 * | 1/2017 | Regnier ............. H01R 13/6594 |
| 2017/0077643 | A1 | 3/2017 | Zbinden et al. |

OTHER PUBLICATIONS

European Application # 18180210 search report dated Nov. 23, 2018.

U.S. Appl. No. 16/044,520 office action dated Feb. 26, 2019.

"Cisco 40GBASE QSFP+ Modules", Data sheet, 7 pages, Oct. 2012.

International Electrotechnical Commission, Standard IEC-61754-7, "Fibre optic interconnecting devices and passive components—Fibre optic connector interfaces—Part 7: Type MPO connector family", Edition 3.0, 32 pages, Mar. 2008.

International Electrotechnical Commission, Standard IEC-61754-5, "Fibre optic connector interfaces—Part 5: Type MT connector family", Edition 2.0, 32 pages, Jul. 2005.

Mellanox Technologies, "Quad to Serial Small Form Factor Pluggable Adapter: Enabling VPI/40GigE Connectivity on 1/10GigE Infrastructure", 1 page, USA 2010.

SFF Committee, "SFF-8431 Specifications for Enhanced Small Form Factor Pluggable Module SFP+", Revision 4.1, 132 pages, Jul. 6, 2009.

SFF Committee, "SFF-8436 Specification for QSFP+ Copper and Optical Modules", Revision 3.4, 71 pages, Nov. 12, 2009.

SFF Committee, "INF-8438i Specification for QSFP (Quad Small Formfactor Pluggable) Transceiver", Revision 1.0, 75 pages, Nov. 2006.

Barrass et al, "10GBASE-T: 10 Gigabit Ethernet over Twisted-pair Copper", Ethernet Alliance, Version 1.0, Austin, USA, 44 pages, Aug. 2007.

Aquantia Corporation, Quad 10GBASE-T Product Brief, Version 1.0, Milpitas, USA, 2 pages, Apr. 23, 2009.

IEEE Standard 802.3an-2006, "IEEE Standard for Information technology—Telecommunications and information exchange between systems—Local and metropolitan area networks—Specific requirements; Part 3: Carrier Sense Multiple Access with Collision Detection (CSMA/CD) Access Method and Physical Layer Specifications; Amendment 1: Physical Layer and Management Parameters for 10 Gb/s Operation, Type 10GBASE-T", 181 pages, Sep. 1, 2006.

Solarflare Communications, Inc., "Solarflare SFN5122F Dual-Port 10G Ethernet Enterprise Server Adapter", Product Brief, 2 pages, year 2011.

Teranetics—PLX Technology, Inc., "Dual-Speed 10GBase-T / 1000 Base-T Ethernet Physical Layer Device", Product Brief, 3 pages, year 2010.

Kazav et al., U.S. Appl. No. 15/635,236, filed Jun. 28, 2017.

Cisco, "Cisco QSFP to SFP or SFP+ Adapter Module", 3 pages, Jun. 24, 2017.

Mellanox Technologies, "10Gb/s DynamiX QSATM QSFP+ to SFP+ Adapter", 3 pages, Feb. 8, 2018.

QSFP-DD MSA, "QSFP-DD Hardware Specification for QSFP Double Density 8X Pluggable Transceiver", Revision 3.0, 69 pages, Sep. 19, 2017.

(56) References Cited

OTHER PUBLICATIONS

SFP-DD MSA, "SFP-DD Hardware Specification for SFP Double Density 2X Pluggable Transceiver", Revision 1.1, 49 pages, Jan. 7, 2018.
U.S. Appl. No. 16/423,206 office action dated Jan. 7, 2020.
U.S. Appl. No. 16/355,753 office action dated Jan. 31, 2020.

* cited by examiner

CABLE ADAPTER

CROSS-REFERENCE TO RELATED APPLICATION

This application is a continuation-in-part of U.S. patent application Ser. No. 15/635,236, filed Jun. 28, 2017, which is incorporated herein by reference.

FIELD OF THE INVENTION

The present invention relates generally to data communications, and specifically to adapters for bridging between connectors of different types.

BACKGROUND OF THE INVENTION

Small Form-factor Pluggable (SFP) modules are used in various telecommunication and data networking applications to interface between a printed circuit board in a network device and a network cable (which may be electrical or fiberoptic). Typically, the SFP receptacle is mounted on the printed circuit board with appropriate electrical connections to the circuit traces on the board, and a connector at the end of the cable plugs into the receptacle. The connector itself commonly contains signal conversion circuitry and is therefore referred to as a "transceiver."

The mechanical and electrical characteristics of various SFP modules have been defined by industry organizations. For example, Quad Small Form-factor Pluggable (QSFP) modules support four parallel communication channels at 10 Gb/s. The mechanical and electrical characteristics of QSFP modules are described in the SFF-8436 Specification for QSFP+ Copper and Optical Modules (Revision 3.4, November, 2009).

Other types of SFP modules can have different mechanical and electrical characteristics, as defined by the respective standards. For example, Octal Small Form Factor Pluggable (OSFP) is a new form factor with eight high-speed electrical lanes that will initially support 400 Gbps (8×50G). Electrical and mechanical specifications for OSFP were recently released by the OSF Multi Source Agreement (MSA) Group and are available on line at osfpmsa.org. According to the specifications, OSFP connectors are slightly wider and deeper than the QSFP form factor and have an integrated heat-sink that is said to improve thermal performance. The OSFP MSA Web site suggests that it is possible to build an adapter that supports existing 100G QSFP optics modules in an OSFP cage.

Adapters for connecting SFP plugs of a given type to an SFP receptacle of a different type are known in the art. For example, U.S. Pat. No. 7,934,959, whose disclosure is incorporated herein by reference, describes an adapter includes a mechanical frame, which is configured to be inserted into a four-channel Small Form-Factor Pluggable (SFP) receptacle and to receive inside the frame a single-channel SFP cable connector. First electrical terminals, held by the mechanical frame, are configured to mate with respective first pins of the receptacle. Second electrical terminals, held within the mechanical frame, are configured to mate with respective second pins of the connector. Circuitry couples the first and second electrical terminals so as to enable communication between the connector and one channel of the receptacle while terminating the remaining channels of the receptacle.

SUMMARY

Embodiments of the present invention provide adapters and methods that enable one type of multi-channel connector to be plugged into a multi-channel receptacle or a different type.

There is therefore provided, in accordance with an embodiment of the invention, a communication device, including a mechanical frame, which is configured to be inserted into a multi-channel Small Form-Factor Pluggable (SFP) receptacle that is compliant with a first SFP standard and to receive inside the frame an SFP connector that is compliant with a second SFP standard, which is different from the first SFP standard. First electrical terminals are held by the mechanical frame and configured to mate with respective first pins of the SFP receptacle. Second electrical terminals are electrically coupled within the mechanical frame to the first electrical terminals and configured to mate with respective second pins of the SFP connector. A heat sink is mounted in the mechanical frame. The heat sink is configured to make a positive contact with the SFP connector when the SFP connector is inserted into the mechanical frame and to be contained completely within the SFP receptacle when the mechanical frame is inserted into the SFP receptacle.

In the disclosed embodiments, the heat sink includes a structure having a volume of at least 100 $mm^3$, and possibly at least 1000 $mm^3$. In one embodiment, the heat sink includes an array of fins extending away from the mechanical frame.

In some embodiments, the device includes a spring-loaded clamp, which connects the heat sink to the mechanical frame while exerting force against the heat sink so as to press the heat sink into the positive contact with the SFP connector. In a disclosed embodiment, the mechanical frame contains an open window, and the heat sink is mounted over the window and is depressed through the window by the spring-loaded clamp so as to make the positive contact with the SFP connector.

Additionally or alternatively, the mechanical frame includes a lip adjacent to the heat sink, wherein the lip is canted so as to direct a flow of air between the SFP receptacle and the heat sink.

In a disclosed embodiment, the first and second electrical terminals mate with the respective first and second pins by engagement of respective edge connectors.

Additionally or alternatively, the mechanical frame has a first end configured for insertion into the SFP receptacle and a second end configured to receive the SFP connector therethrough, and the mechanical frame includes elastic conductive elements, which protrude outward from the second end of the mechanical frame and are configured to contact a conductive inner surface of the SFP receptacle when the device is fully inserted into the SFP receptacle.

In one embodiment, the first SFP standard is an Octal SFP (OSFP) standard, while the second SFP standard is a Quad Small Form-factor Pluggable (QSFP) standard.

There is also provided, in accordance with an embodiment of the invention, a method for communication, which includes inserting an adapter into a multi-channel Small Form-Factor Pluggable (SFP) receptacle that is compliant with a first SFP standard. The adapter includes a mechanical frame, which is configured to be inserted into the receptacle and to receive inside the frame an SFP connector that is compliant with a second SFP standard, which is different from the first SFP standard. First electrical terminals are held by the mechanical frame and configured to mate with respective first pins of the SFP receptacle. Second electrical terminals are electrically coupled within the mechanical frame to the first electrical terminals and configured to mate with respective second pins of the SFP connector. A heat sink is mounted in the mechanical frame. The heat sink is configured to make a positive contact with the SFP connector when the SFP connector is inserted into the mechanical frame and to be contained completely within the SFP receptacle when the mechanical frame is inserted into the SFP receptacle. The SFP connector is inserted into the adapter.

The present invention will be more fully understood from the following detailed description of the embodiments thereof, taken together with the drawings in which:

DETAILED DESCRIPTION OF EMBODIMENTS

Notwithstanding the suggestion on the OSFP MSA Web site that it is possible to build an adapter that supports existing QSFP optics modules in an OSFP cage, there are a number of incompatibilities between the OSFP and QSFP standards that create difficulty in practical implementation of such an adapter. For example, the OSFP standard requires connectors to have an integrated heat sink, which does not exist in common QSFP designs.

Embodiments of the present invention that are described herein provide an adapter that overcomes problems of inter-standard compatibility, including particularly problems of heat dissipation, as well as satisfying the mechanical, electrical and radio-frequency (RF) shielding demands of the standards in question. The embodiments described hereinbelow are directed particularly to resolving issues that arise in adapting an OSFP receptacle to receive a QSFP cable connector, but the principles of the present invention may similarly be applied, mutatis mutandis, in producing adapters for use with other SFP standards.

In the present embodiments, a communication device, for use as an inter-standard adapter, comprises a mechanical frame, which is configured to be inserted into an SFP receptacle that is compliant with one SFP standard and to receive inside the frame an SFP cable connector (referred to hereinafter and in the claims simply as an "SFP connector") that is compliant with another, different SFP standard. The frame holds a set of electrical terminals that mate with respective first pins of the SFP receptacle and are electrically coupled within the mechanical frame to another set electrical terminals that mate with the pins of the SFP connector.

A heat sink is mounted on the mechanical frame so as to make a positive contact with the SFP connector when the SFP connector is inserted into the mechanical frame, thus ensuring effective heat dissipation from the entire device. The term "positive contact" is used in the present description and in the claims to mean that the surface of the heat sink exerts a force against the adjacent surface of the connector in a direction normal to the surfaces. Thus, the surfaces are in mechanical and thermal contact with one another, without an intervening layer of air that would otherwise impede conduction of heat from the connector to the heat sink. In one embodiment, for example, this positive contact is achieved by means of a spring-loaded clamp, which connects the heat sink to the mechanical frame. The clamp exerts force against the heat sink, which presses the heat sink through a window in the frame and thus creates the desired positive contact between the heat sink and the connector.

Figure 1A:
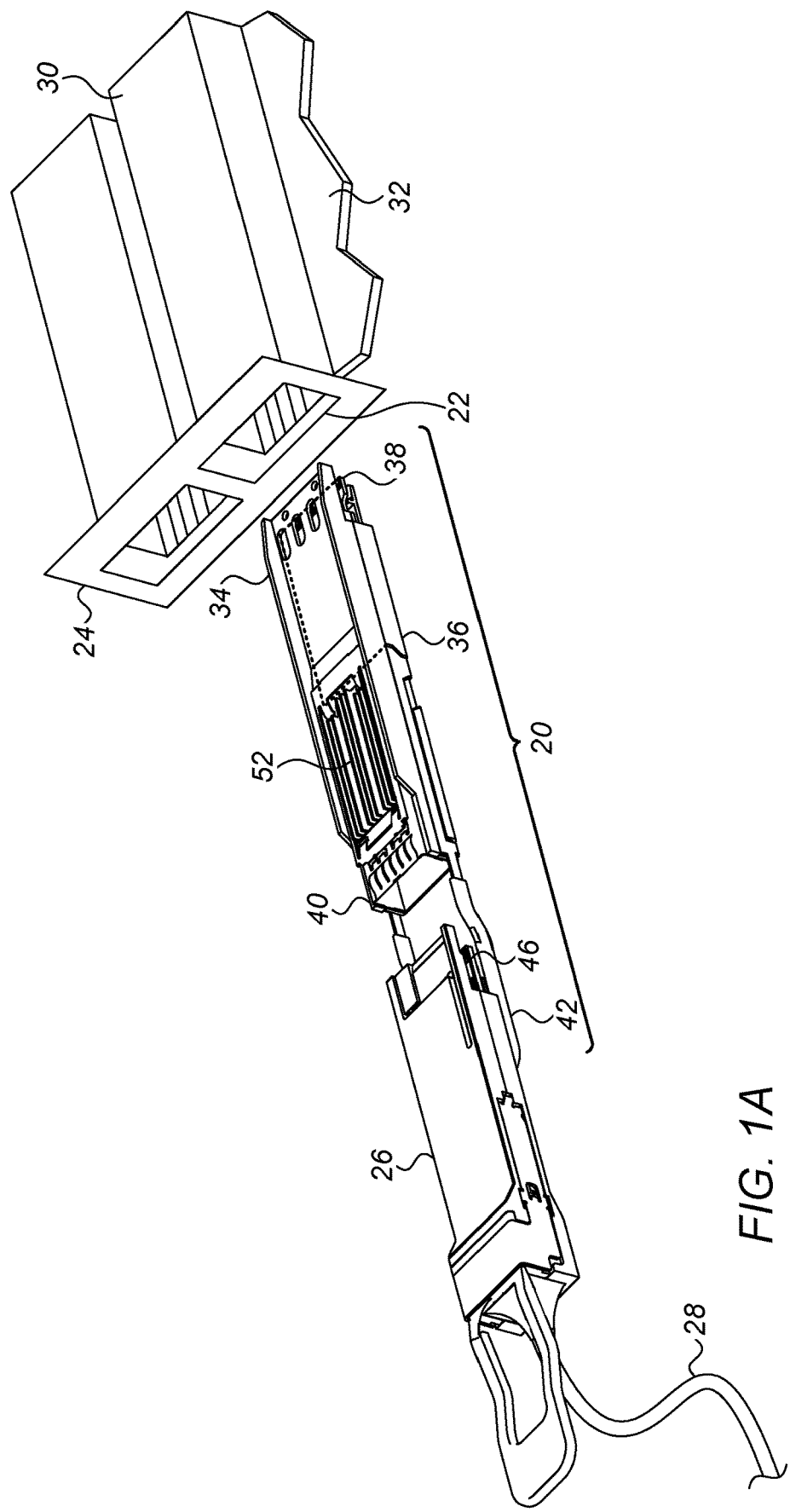
FIG. 1A is a schematic, pictorial illustration showing insertion of a cable connector into a cable connection adapter that is to be plugged into a receptacle, in accordance with an embodiment of the present invention.
Figure 1B:
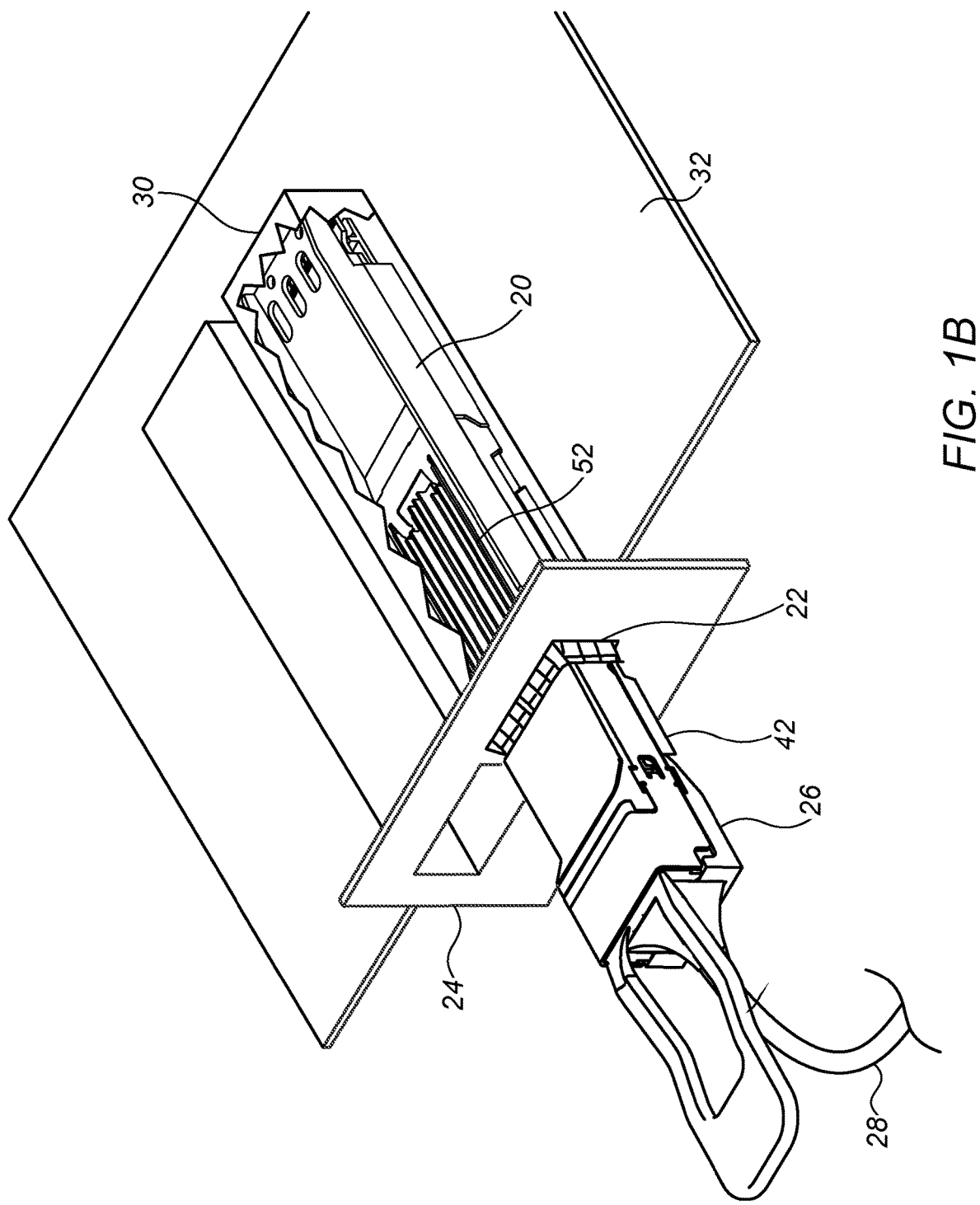
FIG. 1B is a schematic, pictorial illustration showing the cable connector and cable connection adapter of FIG. 1A with the cable connector plugged into the cable connection adapter and the cable connection adapter plugged into the receptacle, in accordance with an embodiment of the present invention.

References is now made to FIGS. 1A and 1B, which are schematic, pictorial illustrations showing insertion of a cable connector 26 into a cable connection adapter 20 that is plugged into a receptacle 22, in accordance with an embodiment of the present invention. FIG. 1A shows connector 26, adapter 20 and receptacle 22 prior to being inserted one into another and plugged in, while FIG. 1B shows connector 26 plugged into adapter 20 and adapter 20 plugged into receptacle 22. In the pictured example, receptacle 22 is of a type that is compliant with the OSFP standard, while connector 26 is QSFP-compliant. Receptacle 22 comprises a cage 30, which is mounted on a printed circuit board 32 behind a panel 24 of a communication device.

Connector 26 typically contains a suitable electrical or fiberoptic transceiver (not shown), in accordance with QSFP specifications, and is connected to the end of a cable 28, which accordingly contains either electrical or fiberoptic signal lines. Cable 28 and connector 26 may contain either four signal lanes, as provided by the original QSFP standard, or eight signal lanes, in accordance with the new QSFP-DD standard, which has the same mechanical form factor as QSFP but with an additional row of contacts providing for an eight-lane electrical interface. Connector 26 terminates in a set of pins 46, comprising conductive pads at the end of a circuit board, which is inserted into an edge connector in adapter (shown in the figures that follow).

Adapter 20 comprises a mechanical frame, which is made up of an upper shell 34, a lower shell 36, and a cage 40. The frame is made to be inserted into OSFP receptacle 22, as though adapter 20 were an OSFP connector, and to receive QSFP connector 26 through the other end of the frame, as though cage 40 were a QSFP receptacle. Electrical terminals 38 of adapter 20, held by the mechanical frame, mate with respective pins (not shown) inside cage 30 of receptacle 22. Specifically, in the present example, terminals 38 comprise conductive pads at the end of a circuit board inside adapter 20, which is inserted into an edge connector in cage 30. An integral latch 42 enables easy removal of adapter 20 from receptacle by pulling on the latch. A heat sink 52 is mounted on the mechanical frame (specifically, in this embodiment, on upper shell 34) so as to make a positive contact with connector 26 inside cage 40. As shown in FIG. 1B, heat sink 52 is contained completely within cage 30 of receptacle 22 when the mechanical frame of adapter 20 is inserted into the receptacle, thus maintaining both inter-standard compatibility and good heat dissipation.

Figure 2:
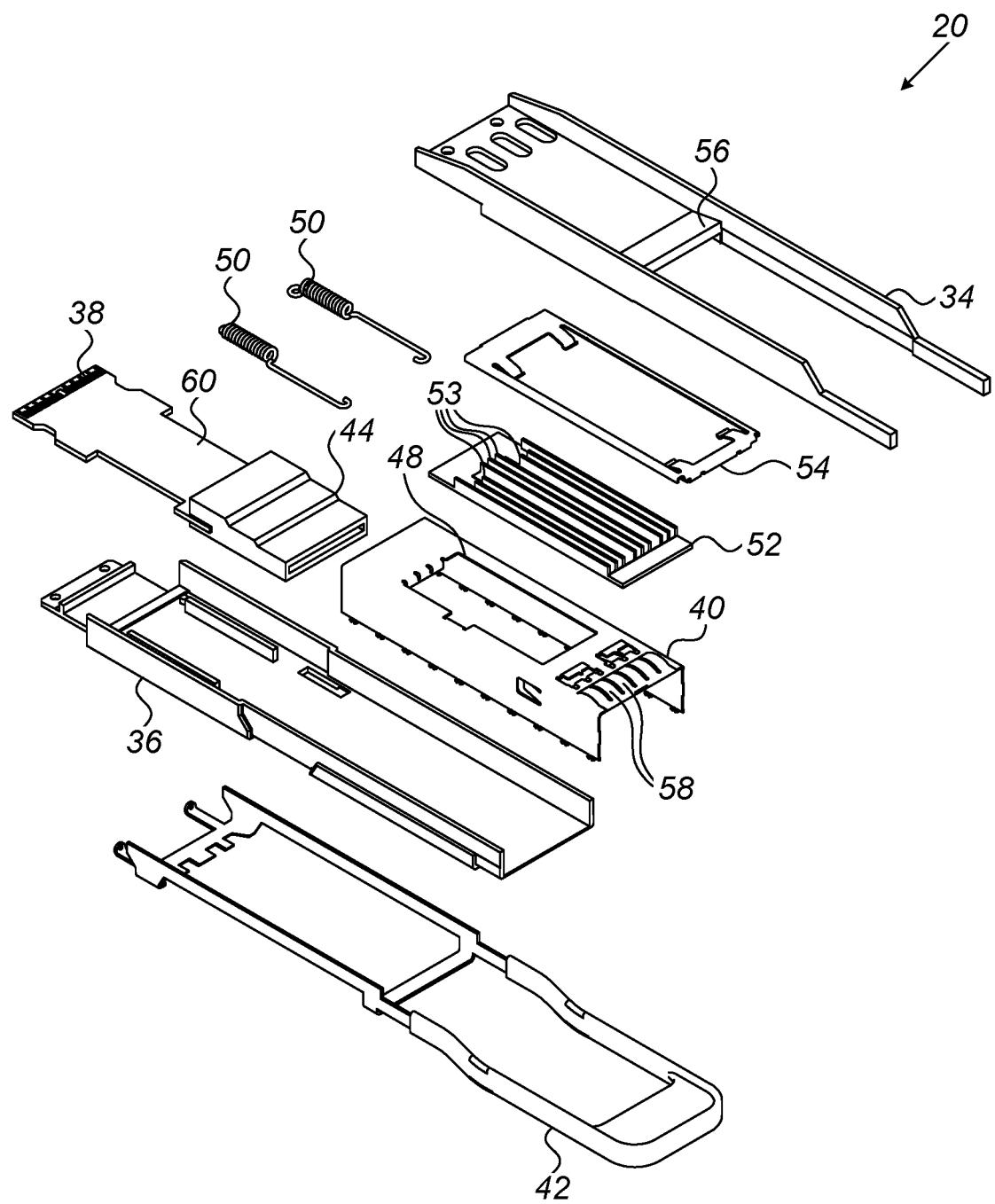
FIG. 2 is an exploded view of a cable connection adapter, in accordance with an embodiment of the invention.
Figure 3:
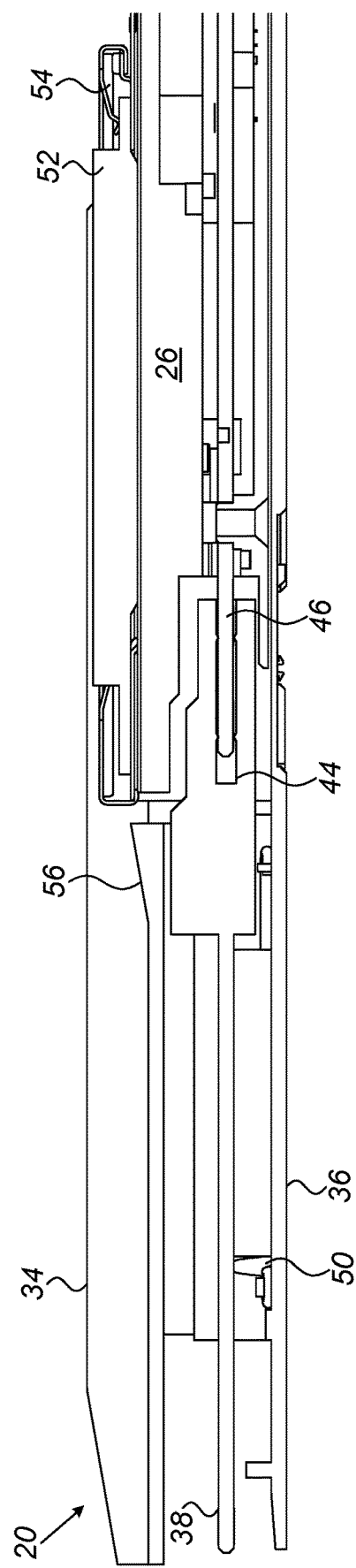
FIG. 3 is a schematic sectional view of a cable connection adapter, in accordance with an embodiment of the invention.
Figure 4:
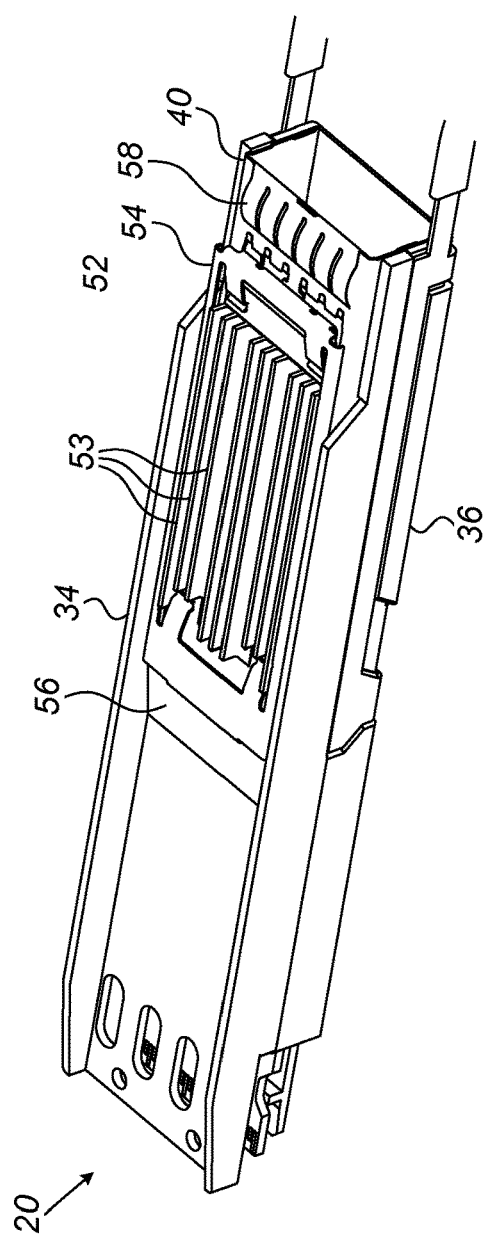
FIGS. 4 and 5 are schematic detail views of a cable connection adapter, in accordance with an embodiment of the invention.
Figure 5:
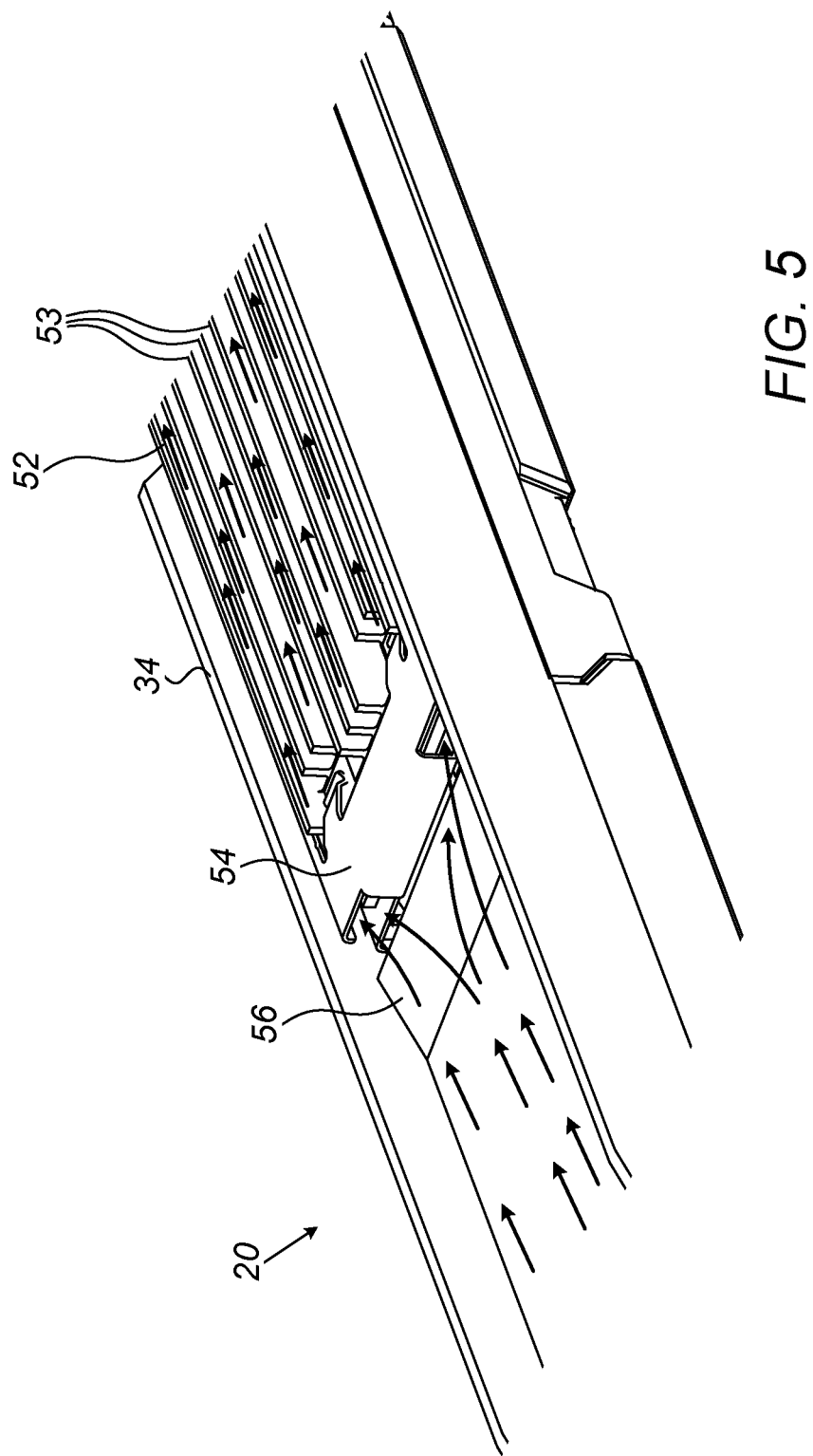

Reference is now made to FIGS. 2-5, which schematically show details of the construction and operation of adapter 20, in accordance with an embodiment of the invention. FIG. 2 is an exploded view, FIG. 3 is a sectional view, and FIGS. 4 and 5 are pictorial detail views of adapter 20.

As can be seen in these figures, heat sink 52 comprises an array of fins 53 extending away from the mechanical frame of adapter 20. Alternatively, heat sink 52 may comprise any other suitable sort of heat dissipation structure that is known in the art, such as pins, a vapor chamber, a block containing heat pipes, a heat exchanger, or an active cooling element such as a thermo-electric device, for example. In any case, the structure of heat sink 52 has a large enough volume to absorb and conduct away heat generated within adapter 20 at a sufficient rate to keep the temperature of connector 26 from exceeding its specified operating range. In QSFP applications, for instance, heat sink 52 should be capable of dissipating heat at a rate of at least 1.5 W. To meet these requirements, the volume of heat sink 52 (calculated as the product of the outer dimensions of the heat sink) should be at least 100 mm$^3$. This volume may advantageously be 1000 mm$^3$ or more, subject to the limitation that heat sink 52 be contained completely within receptacle 22 when the mechanical frame of adapter 20 is inserted into the receptacle.

A spring-loaded clamp 54 connects heat sink 52 to cage 40 while exerting force against the heat sink. Cage 40 contains an open window 48 (shown in FIG. 2), over which heat sink 52 is mounted. Clamp 54 thus depresses heat sink 52 through window 48 so as to make positive contact with connector 26, as illustrated in FIG. 3. Upper shell 34 comprises a lip 56, which is adjacent to heat sink 52 when adapter 20 is assembled. Lip 56 is canted so as to direct a flow of air between receptacle 22 and heat sink 52, as illustrated in FIG. 5. This design takes advantage of the cooling system (not shown) in the communication device behind panel 24, which blows air out or, possibly, sucks air in through receptacles 22 and thus cools adapter 20, as well as other connectors that are plugged into the receptacles.

As shown in FIG. 3, pins 46 of connector 26 mate with corresponding terminals in an edge connector 44 inside cage 40. Edge connector 44 is mounted on one end of a circuit board 60, which is mounted inside adapter 20 and has traces (not shown) that connect the terminals in edge connector 44 to corresponding terminals 38 at the other end of board 60, which plugs into receptacle 22. Edge connector 44 and board 60 are arranged to route the QSFP signals from pins 46 to the corresponding OSFP pins in receptacle 22, regardless of whether connector 26 is a legacy QSFP connector with four lanes or a QSFP-DD connector with eight lanes. Board 60 and terminals 38 are arranged so that in the former case, with a legacy QSFP connector, only four of the eight lanes in receptacle 22 actually receive signals.

As can be seen in FIGS. 2 and 4, cage 40 comprises elastic conductive elements, in the form of springs or fingers 58, which protrude outward from the end of the mechanical frame into which connector 26 is inserted.

Fingers 58 contact the conductive inner surface of receptacle 22 when adapter 20 is fully inserted into the receptacle, and thus ground cage 40 and shield circuits inside and outside the communication device behind panel 24 from possible electromagnetic interference (EMI) due to the electrical signals in connector 26.

Latch 42 is connected to lower shell 36 by springs 50. After insertion of adapter 20 into receptacle 22, the springs 50 hold latch 42 in place and thus secure the connection between the adapter and the receptacle. Pulling back on latch 42 momentarily stretches springs 50 and releases adapter 20 from receptacle 22. Thus, during use, adapter 20 is held securely in receptacle 22, and connector 26 is held securely in adapter 20; but either adapter 20 or connector 26 can be released and pulled out quickly and easily when desired, without risk of damage to the adapter or to cable 28. Although the figures show a particular sort of latch, the principles of this embodiment are equally applicable to other latching mechanisms that are known in the art, such as the type of mechanism that is used in standard QSFP connectors.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A communication device, comprising:
a mechanical frame, which is configured to be inserted into a multi-channel Small Form-Factor Pluggable (SFP) receptacle that is compliant with a first SFP standard and to receive inside the frame an SFP connector that is compliant with a second SFP standard, which is different from the first SFP standard;
first electrical terminals, held by the mechanical frame and configured to mate with respective first pins of the SFP receptacle;
second electrical terminals, electrically coupled within the mechanical frame to the first electrical terminals and configured to mate with respective second pins of the SFP connector; and
a heat sink mounted on the mechanical frame, wherein the heat sink is configured to make a positive contact with the SFP connector when the SFP connector is inserted into the mechanical frame and to be contained completely within the SFP receptacle when the mechanical frame is inserted into the SFP receptacle.

2. The device according to claim 1, wherein the heat sink comprises a structure having a volume of at least 100 mm$^3$.

3. The device according to claim 2, wherein the volume of the heat sink is at least 1000 mm$^3$.

4. The device according to claim 1, wherein the heat sink comprises an array of fins extending away from the mechanical frame.

5. The device according to claim 1, and comprising a spring-loaded clamp, which connects the heat sink to the mechanical frame while exerting force against the heat sink so as to press the heat sink into the positive contact with the SFP connector.

6. The device according to claim 5, wherein the mechanical frame contains an open window, and wherein the heat sink is mounted over the window and is depressed through the window by the spring-loaded clamp so as to make the positive contact with the SFP connector.

7. The device according to claim 1, wherein the mechanical frame comprises a lip adjacent to the heat sink, wherein the lip is canted so as to direct a flow of air between the SFP receptacle and the heat sink.

8. The device according to claim 1, wherein the first and second electrical terminals mate with the respective first and second pins by engagement of respective edge connectors.

9. The device according to claim 1, wherein the mechanical frame has a first end configured for insertion into the SFP receptacle and a second end configured to receive the SFP connector therethrough, and the mechanical frame comprises elastic conductive elements, which protrude outward from the second end of the mechanical frame and are configured to contact a conductive inner surface of the SFP receptacle when the device is fully inserted into the SFP receptacle.

10. The device according to claim 1, wherein the first SFP standard is an Octal SFP (OSFP) standard, while the second SFP standard is a Quad Small Form-factor Pluggable (QSFP) standard.

11. A method for adapting a connector, comprising:
inserting an adapter into a multi-channel Small Form-Factor Pluggable (SFP) receptacle that is compliant with a first SFP standard, the adapter comprising:
a mechanical frame, which is configured to be inserted into the receptacle and to receive inside the frame an SFP connector that is compliant with a second SFP standard, which is different from the first SFP standard;
first electrical terminals, held by the mechanical frame and configured to mate with respective first pins of the SFP receptacle;
second electrical terminals, electrically coupled within the mechanical frame to the first electrical terminals and configured to mate with respective second pins of the SFP connector; and
a heat sink mounted in the mechanical frame, wherein the heat sink is configured to make a positive contact with the SFP connector when the SFP connector is inserted into the mechanical frame and to be contained completely within the SFP receptacle when the mechanical frame is inserted into the SFP receptacle; and
inserting the SFP connector into the adapter.

12. The method according to claim 11, wherein the heat sink comprises a structure having a volume of at least 100 mm$^3$.

13. The method according to claim 12, wherein the volume of the heat sink is at least 1000 mm$^3$.

14. The method according to claim 11, wherein the heat sink comprises an array of fins extending away from the mechanical frame.

15. The method according to claim 11, and comprising applying a spring-loaded clamp to connect the heat sink to the mechanical frame while exerting force against the heat sink so as to press the heat sink into the positive contact with the SFP connector.

16. The method according to claim 15, wherein the mechanical frame contains an open window, and wherein the heat sink is mounted over the window and is depressed through the window by the spring-loaded clamp so as to make the positive contact with the SFP connector.

17. The method according to claim 11, wherein inserting the adapter into the SFP receptacle comprises directing a flow of air between the SFP receptacle and the heat sink, wherein the mechanical frame comprises a canted lip which directs the flow of air over the heat sink.

18. The method according to claim 11, wherein the first and second electrical terminals mate with the respective first and second pins by engagement of respective edge connectors.

19. The method according to claim 11, wherein inserting the adapter comprises inserting a first end of the mechanical frame into the SFP receptacle, and wherein inserting the SFP connector comprises inserting the SFP connector through a second end of the mechanical frame, wherein the mechanical frame comprises elastic conductive elements, which protrude outward from the second end of the mechanical frame and contact a conductive inner surface of the SFP receptacle when the adapter is fully inserted into the SFP receptacle.

20. The method according to claim 11, wherein the first SFP standard is an Octal SFP (OSFP) standard, while the second SFP standard is a Quad Small Form-factor Pluggable (QSFP) standard.

* * * * *